US012696721B2

(12) United States Patent
Wang et al.

(10) Patent No.: US 12,696,721 B2
(45) Date of Patent: Jul. 28, 2026

(54) FURNACE TUBE ASSEMBLY AND DISASSEMBLY AUXILIARY DEVICE

(71) Applicant: BEIJING NAURA MICROELECTRONICS EQUIPMENT CO., LTD., Beijing (CN)

(72) Inventors: Qi Wang, Beijing (CN); Jianguo Li, Beijing (CN); Wangping Zhu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/842,627

(22) PCT Filed: Feb. 23, 2023

(86) PCT No.: PCT/CN2023/077788
§ 371 (c)(1),
(2) Date: Aug. 29, 2024

(87) PCT Pub. No.: WO2023/169216
PCT Pub. Date: Sep. 14, 2023

(65) Prior Publication Data
US 2025/0183077 A1     Jun. 5, 2025

(30) Foreign Application Priority Data
Mar. 10, 2022     (CN) .......................... 202210236830.9

(51) Int. Cl.
*H10P 72/30*          (2026.01)
*H10P 72/00*          (2026.01)

(52) U.S. Cl.
CPC ...... *H10P 72/3302* (2026.01); *H10P 72/3304* (2026.01); *H10P 72/0431* (2026.01)

(58) Field of Classification Search
CPC ......... E21B 19/00; E21B 19/15; B61B 13/08; B61J 1/00; B61J 1/10; B65G 1/0442; B65G 13/12
(Continued)

(56) References Cited

U.S. PATENT DOCUMENTS 7,198,452 B2 *   4/2007   Kirykowicz .......... B23Q 7/005
                                            198/346.2

FOREIGN PATENT DOCUMENTS

CN          111168633  A        5/2020
CN          112573428  A        3/2021
(Continued)

OTHER PUBLICATIONS

The World Intellectual Property Organization (WIPO) International Search Report for PCT/CN2023/077788 Jun. 16, 2023 6 Pages (including translation).

*Primary Examiner* — Ronald P Jarrett
(74) *Attorney, Agent, or Firm* — ANOVA LAW GROUP, PLLC

(57)          ABSTRACT

The present disclosure provides a furnace tube assembly and disassembly auxiliary device configured to support a furnace tube when the furnace tube of horizontal semiconductor equipment is mounted to a furnace body or is removed from the furnace body. The furnace tube assembly and disassembly auxiliary device includes a base configured to detachably be connected to a loading and unloading mechanism of the horizontal semiconductor equipment to cause the loading and unloading mechanism to drive the base to ascend and descend vertically, and a supporting body arranged on the base and moving along a first horizontal direction relative to (Continued)

the base. The supporting body includes a rolling support structure. The rolling support structure is configured to support the furnace tube, and the rolling support structure is roll-cooperated with the furnace tube to cause the furnace tube to move along a second horizontal direction.

9 Claims, 5 Drawing Sheets

(58) Field of Classification Search
USPC ...... 414/22.71, 589, 745.3, 749.1; 193/35 R,
193/35 TE; 104/94, 96, 99, 100, 102,
104/106, 107, 135; 105/155; 198/456,
198/456.3, 457.01, 780, 781.04, 782, 789
See application file for complete search history.

(56) References Cited

FOREIGN PATENT DOCUMENTS

| | | | |
|----|----------|----|--------|
| CN | 213731506 | U | 7/2021 |
| CN | 113380668 | A | 9/2021 |
| CN | 114505816 | A | 5/2022 |
| KR | 20080057395 | A | 6/2008 |
| SU | 1206593 | A1 | 1/1986 |

* cited by examiner

FURNACE TUBE ASSEMBLY AND DISASSEMBLY AUXILIARY DEVICE

CROSS-REFERENCE TO RELATED APPLICATIONS

This application is a national phase entry under 35 U.S.C. § 371 of International Application No. PCT/CN2023/077788, filed on Feb. 23, 2023, which claims priority to Chinese Application No. 202210236830.9 filed Mar. 10, 2022, the entire contents of all of which are incorporated herein by reference.

TECHNICAL FIELD

The present disclosure generally relates to the semiconductor equipment technical field and, more particularly, to a furnace tube assembly and disassembly auxiliary device.

BACKGROUND

As semiconductor-related industries (such as the photovoltaic industry) continue to impose higher requirements on wafer sizes and production capacity, the requirement for the size of the overall equipment and components also need to be increased correspondingly. Taking horizontal diffusion equipment as an example, the horizontal diffusion equipment usually includes a furnace body and a plurality of furnace tubes (e.g., quartz tubes) installed within the furnace body. The plurality of furnace tubes are arranged vertically at intervals, each furnace tube extends in a horizontal direction. The internal space of each furnace tube forms a reaction chamber. To be suitable for a wafer with a large size and high capacity, an overall height of the horizontal diffusion equipment is relatively high. The installation height (i.e., a height from an installation operation surface to a ground surface) at furnace tubes that correspondingly abut against each other is also high. The size and weight of each furnace tube are relatively large. For example, an overall net height of the horizontal diffusion equipment can reach 4100 mm. The installation height at the top furnace tube can exceed 3500 mm. The length of each furnace tube exceeds 3500 mm, an outer radius is about 400 mm, and the weight can be above 50 kg.

In the existing technology, the installation process for installing the furnace tube to the furnace body, and the disassembling process of disassembling the furnace tube from the furnace body can be performed manually. The installation process can include the following processes.

The operators are divided into two groups. The first operator group can enter a purification station. The group of operations usually includes four to six persons arranged vertically in a column. The second operator group is located outside of the horizontal diffusion device. While performing furnace tube installation, the second operator group can transfer the furnace tube into the purification station. After receiving the furnace tube, the first operator group can lift the furnace tube upward to be near the required installation height. Then, the relative position between the furnace tube and the furnace body can be aligned manually. Then, the furnace tube can be transferred forward in sequence to eventually push the furnace tube into the furnace body.

The disassembly process can be opposite to the installation process, which is not repeated here. During the installation and disassembly process of the furnace tube, the furnace tube always needs to be lifted manually. The lifting of the furnace tube and the alignment of the position between the furnace tube and the furnace body also need to be finished manually while lifting. Since the furnace tube has a large size and weight and a high installation height, the installation and disassembly difficulty of the furnace tube is high, which is labor-intensive.

In addition, the furnace tube is made of a fragile material. The furnace tube can chip, or the tail tube can break due to the hands of the operator being unstable. In severe cases, the furnace tube becomes a scrap. Meanwhile, the operator is always in a high-altitude load-bearing operation status during the installation and disassembly process of the furnace tube. The operation risk is high, and a certain safety hazard exists.

SUMMARY

The present disclosure is intended to solve one of the technical problems in the existing technology and provides a furnace tube assembly and disassembly auxiliary device, which can solve the difficulty in installing and removing the furnace tube in the existing technology and can reduce the risk of damaging the furnace tube, operation risk, and safety issue.

The present disclosure provides a furnace tube assembly and disassembly auxiliary device, configured to support a furnace tube when the furnace tube of horizontal semiconductor equipment is mounted to a furnace body or is removed from the furnace body. The furnace tube assembly and disassembly auxiliary device includes a base configured to detachably be connected to a loading and unloading mechanism of the horizontal semiconductor equipment to cause the loading and unloading mechanism to drive the base to ascend and descend vertically, and a supporting body arranged on the base and moving along a first horizontal direction relative to the base. The supporting body includes a rolling support structure. The rolling support structure is configured to support the furnace tube. The rolling support structure is roll-cooperated with the furnace tube to cause the furnace tube to move along a second horizontal direction. The second horizontal direction has a predetermined angle with the first horizontal direction.

In some embodiments, the rolling support structure includes a plurality of rolling unit groups. The plurality of rolling unit groups is arranged side by side along the first horizontal direction. Each rolling unit group includes a plurality of rolling units. The plurality of rolling units is arranged at intervals along the second horizontal direction, and when the furnace tube is pushed, at least a part of the rolling units in contact with the furnace tube roll-cooperate with the furnace tube.

In some embodiments, the supporting body includes a plurality of first guide members. The plurality of first guide members is in a one-to-one correspondence with the plurality of rolling unit groups. The rolling unit is slidably arranged on first guide member corresponding to a rolling unit group, with the rolling units being movably arranged along the second horizontal direction on the corresponding first guide member.

In some embodiments, the first guide member includes an accommodation groove extending along the second horizontal direction. The rolling unit includes a first rolling element, a second rolling element, and a connection shaft. The first rolling element is configured to support the furnace tube. The second rolling element is arranged in the accommodation groove. The connection shaft is configured to rotatably connect the first rolling member and the second rolling member.

In some embodiments, the supporting body includes two mounting bases arranged opposite to each other along the second horizontal direction. Two ends of the first guide member are connected to the two mounting bases, respectively, and neighboring two first guide members are connected by reinforcement connectors.

In some embodiments, the supporting body also includes a plurality of auxiliary support structures. The plurality of auxiliary support structures is arranged at intervals along the second horizontal direction. The furnace tube is above the auxiliary support structures and has a gap between the auxiliary support structures when being placed on the rolling support structure. The plurality of auxiliary support structures is configured to auxiliary support the furnace tube when the rolling support structure fails.

In some embodiments, the auxiliary support structures are made of elastic material, and/or the top of the auxiliary support structures has an arc-shaped support surface of the furnace tube. The shape of the arc-shaped support surface is adapted to a shape of the outer wall of the furnace tube.

In some embodiments, the furnace tube assembly and disassembly auxiliary device further includes a handheld structure and a mobile guide structure. The handheld structure is connected to the supporting body, and manually pushed and pulled to drive the supporting body to move relative to the base in the first horizontal direction. The mobile guide structure includes a second guide member and a sliding member. The second guide member is connected to one of the bases and the supporting body. The sliding member is connected to the other one of the bases and the supporting body. The sliding member is slidably arranged at the second guide member. The supporting body is guided when the handheld structure is manually pushed and pulled to drive the supporting body to move. The mobile guide structure guides the supporting body.

In some embodiments, the supporting body includes two mounting bases arranged opposite to each other along the second horizontal direction. Two bases and two mobile guide structures are provided. The two bases are arranged below the two mounting bases, respectively. The two mobile guide structures are arranged between the corresponding mounting bases and the bases, respectively. Two ends of the handheld structure are connected to the two mounting bases, respectively, to drive the two mounting bases to move synchronously when the handheld structure is pushed and pulled.

In some embodiments, the furnace tube assembly and disassembly auxiliary device further includes a locking structure. The locking structure cooperates with the base and the supporting body. The locking structure is configured to lock the movement of the support body relative to the base along the first horizontal direction.

In some embodiments, the base includes a robotic manipulator connector and/or a mounting pad. The robotic manipulator connector is configured to be detachably connected to the robotic manipulator of the loading and unloading mechanism. The mounting pad is arranged at the bottom surface of the base. The mounting pad is configured to contact and cooperate with the robotic manipulator after the base is connected to the robotic manipulator of the loading and unloading mechanism, through the contact and cooperation of the mounting pad and the robotic manipulator, provides support to the base.

The furnace tube assembly and disassembly auxiliary device provided by the present disclosure can be connected to the original loading and unloading mechanism of horizontal semiconductor equipment without affecting the original structure of the equipment. The application range can be broad. In the installation and removal of the furnace tube, the furnace tube is mainly supported by the furnace tube assembly and disassembly auxiliary device. That is, most of the weight of the furnace tube is transferred to the furnace tube assembly and disassembly auxiliary device. The operator does not need to lift and support the furnace tube. The operator can ascend and descend the furnace tube by using the loading and unloading mechanism and realize the position alignment between the furnace tube and the furnace body. After the furnace tube is aligned with the furnace body, the operator may need to push the furnace tube into the furnace body through manpower. Then, since the furnace tube is placed on the rolling support structure, in the process of the operator pushing the furnace tube, the furnace tube may roll-cooperate with the rolling support structure. Thus, the friction to the furnace tube can be reduced as much as possible to facilitate the operator to perform the push operation.

Thus, compared to the existing method of manual assembly and disassembly, using the above furnace tube assembly and disassembly auxiliary device can have stronger operability to reduce the difficulty of equipment installation and maintenance. The operator can have a low operation strength, with less labor intensive. Meanwhile, the furnace tube assembly and disassembly auxiliary device can reliably and stably support the furnace tube to prevent the operator from climbing high and operating with load. Thus, the operation risk can be lowered, and the safety issues can be reduced.

DETAILED DESCRIPTION OF THE EMBODIMENTS

To cause those skilled in the art to better understand the technical solutions of the present disclosure, a detailed description of a furnace tube assembly and disassembly auxiliary device is provided below in conjunction with the accompanying drawings.

Figure 1:
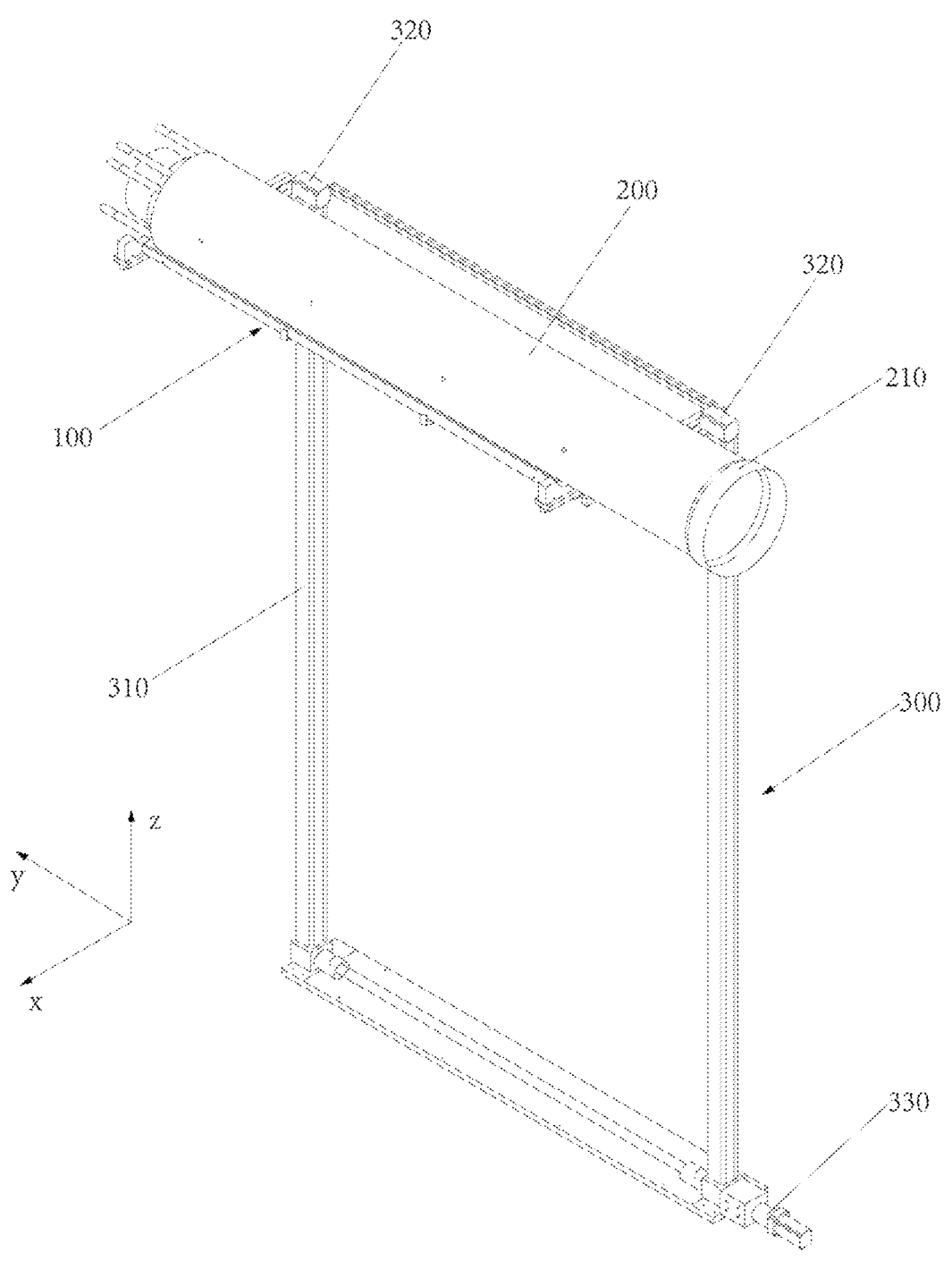
FIG. 1 is a schematic diagram showing a cooperation status of a furnace tube assembly and disassembly auxiliary device and a loading and unloading mechanism when the furnace tube is installed (or removed) according to some embodiments of the present disclosure.

As shown in FIG. 1, the present disclosure provides a furnace tube assembly and disassembly auxiliary device 100. Horizontal semiconductor equipment can include a furnace body (not shown in the figure) and a furnace tube 200 installed on the furnace body. When installed on the furnace body, the furnace tube 200 typically extends horizontally. The furnace tube assembly and disassembly auxiliary device 100 can be configured to support the furnace tube 200 while the furnace tube 200 is installed at or removed from the furnace body.

Figure 2:
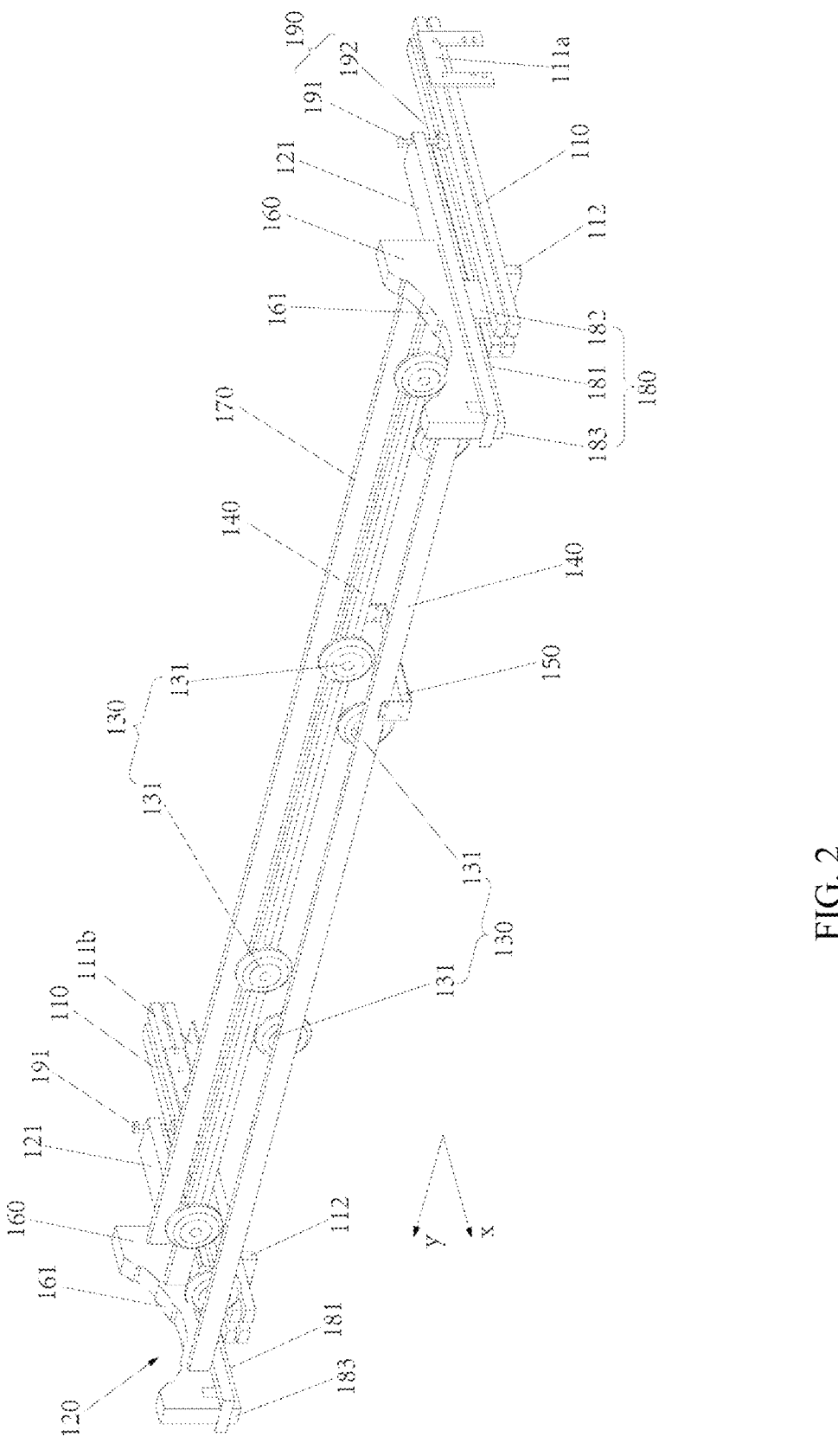
FIG. 2 is a schematic structural diagram of a furnace tube assembly and disassembly auxiliary device according to some embodiments of the present disclosure.

As shown in FIGS. 1 and 2, in some embodiments, the furnace tube assembly and disassembly auxiliary device 100 includes a base 110 and a supporting body 120. The horizontal semiconductor equipment also includes a loading and unloading mechanism 300. The loading and unloading mechanism 300 can be configured to transfer a wafer boat carrying a wafer when the horizontal semiconductor equipment performs processing. The base 110 can be detachably connected to the loading and unloading mechanism 300. When the base 110 is connected to the loading and unloading mechanism 300, the entire furnace tube assembly and disassembly auxiliary device 100 is connected to the loading and unloading mechanism 300. The base 110 can be driven to ascend and descend vertically by the loading and unloading mechanism 300 to drive the entire furnace tube assembly and disassembly auxiliary device 100 to ascend and descend. The supporting body 120 is arranged at the base 110 and can move relative to the base 110 along a first horizontal direction. The supporting body 120 is provided with a rolling support structure. The rolling support structure can be configured to support the furnace tube 200. When the furnace tube 200 is placed on the rolling support structure, and the furnace tube 200 is pushed to move, the rolling support structure can be configured to roll cooperatively along with the furnace tube 200, and cause the furnace tube 200 to move relative to the supporting body 120 along a second horizontal direction. The second horizontal direction and the first horizontal direction can have a predetermined angle. The size of the predetermined angle is not limited and can be set appropriately according to a required movement path when the furnace tube 200 is installed or removed. For example, in some embodiments shown in the figure, the predetermined angle is 90°. That is, the second horizontal direction is perpendicular to the first horizontal direction. In some embodiments, taking an embodiment shown in FIG. 1 as an example, "vertical direction" refers to a z-axis extending direction in FIG. 1, "first horizontal direction" refers to an x-axis extending direction in FIGS. 1 and 2, and "second horizontal direction" refers to a y-axis extending direction in FIGS. 1 and 2.

Taking the installation process of the furnace tube 200 as an example, an operator places the furnace tube 200 on the supporting body 120 of the furnace tube assembly and disassembly auxiliary device 100. Then, the furnace tube 200 can generally extend along the second horizontal direction. With the furnace tube assembly and disassembly auxiliary device 100, the installation process of the furnace tube 200 can be divided into several stable and unidirectional linear movements. In some embodiments, the furnace tube assembly and disassembly auxiliary device 100 and the furnace tube 200 can be first lifted vertically to a required installation height through the loading and unloading mechanism 300. Then, the supporting body 120 can be controlled to move relative to the base 110 along the first horizontal direction to adjust the position of the supporting body 120 and the furnace tube 200 in the first horizontal direction until the furnace tube 200 is roughly aligned with a furnace opening of the furnace body. Then, the operator can push the furnace tube 200 generally along the second horizontal direction. With the rolling support structure, the furnace tube 200 can move relative to the supporting body 120 along the second horizontal direction (for example, the positive y-axis direction shown in FIG. 1) and can be eventually pushed into the furnace body through the furnace opening. The removal process of the furnace tube 200 can be a reverse process of the above installation process, which is not repeated here.

With the loading and unloading mechanism 300 of the furnace tube assembly and disassembly auxiliary device 100, the furnace tube assembly and disassembly auxiliary device 100 can be used after being connected to the loading and unloading mechanism 300, which does not affect the original structure of the equipment. Thus, the application scope is broader. During the installation and removal processes of the furnace tube 200, the furnace tube 200 can be supported by the furnace tube assembly and disassembly auxiliary device 100. That is, most of the weight of the furnace tube is supported by the furnace tube assembly and disassembly auxiliary device 100. The operator does not need to manually support the furnace tube 200 and can accurately align the position between the furnace tube 200 and the furnace body by ascending and descending the furnace tube 200 using the loading and unloading mechanism 300 and the furnace tube assembly and disassembly auxiliary device 100. After the furnace tube 200 is aligned with the furnace opening, the operator can manually push the furnace tube 200 into the furnace body. Since the furnace tube 200 is placed on the rolling support structure, when the operator pushes the furnace tube 200, the furnace tube 200 can roll cooperatively with the rolling support structure to minimize frictional resistance for the furnace tube 200 and facilitate the pushing operation of the operator.

Thus, compared to the existing manual assembly and disassembly method, the operability can be stronger for using the furnace tube assembly and disassembly auxiliary device 100 to install and remove the furnace tube 200. Thus, the difficulty of equipment installation and maintenance can be reduced, the operation intensity of the operator can be relatively low, and labor is less intensive. Meanwhile, the furnace tube assembly and disassembly auxiliary device 100 can reliably and stably support the furnace tube 200, which can beneficially lower the risk of damaging the furnace tube. In addition, the furnace tube 200 is supported by the furnace tube assembly and disassembly auxiliary device 100 can prevent the operator from operating with load at a high altitude, which can reduce the operation risk and safety issues.

It should be noted that the specific types of horizontal semiconductor equipment on which the furnace tube assembly and disassembly auxiliary device 100 can be used to install and remove the furnace tube 200 are not limited. In theory, any equipment with horizontally installed furnace tube 200 and equipped with a loading and unloading mechanism 300 can use the furnace tube assembly and disassembly auxiliary device 100. For example, horizontal semiconductor equipment can include horizontal diffusion equipment, horizontal annealing equipment, PECVD (plasma-enhanced chemical vapor deposition) equipment, LPCVD (low-pressure chemical vapor deposition) equipment, etc.

As shown in FIG. 2, in some embodiments, the rolling support structure includes a plurality of rolling unit groups 130. The plurality of rolling unit groups 130 are arranged side by side along the first horizontal direction. Each rolling unit group 130 includes a plurality of rolling units 131. The plurality of rolling units 131 are spaced apart in the second horizontal direction. In some embodiments, each rolling unit group 130 contains the same number of rolling units 131. The plurality of rolling units 131 of each rolling unit group 130 are in a one-to-one correspondence with the rolling units 131 of other rolling unit groups 130 in the first horizontal direction. Thus, the support force of the rolling support structure applied to the furnace tube 200 can be more even and balanced.

The cross-section of the furnace tube 200 can be usually circular. The plurality of rolling unit groups 130 can be configured to support the furnace tube 200. When the furnace tube 200 is placed on the plurality of rolling unit groups 130, the furnace tube 200 can extend along the second horizontal direction. The plurality of rolling unit groups 130 can contact the outer wall of the furnace tube 200. At the circumference of the outer contour of the cross-section of the furnace tube 200, the plurality of rolling unit groups 130 can contact different positions. At least two of the plurality of rolling unit groups 130 can be on two sides relative to a center of the circumference. Thus, the radial position of the furnace tube 200 can be limited, i.e., the position of the furnace tube 200 can be limited in the first horizontal direction. Thus, when the furnace tube 200 is pushed, the furnace tube 200 can only move along the second horizontal direction and may not move in the first horizontal direction. When the furnace tube 200 is pushed to move, at least a part of the plurality of rolling units contacting the furnace tube 200 can roll cooperatively with the furnace tube 200. In practice, when the furnace tube 200 is pushed to move, as long as a rolling unit 131 contacts the outer wall of the furnace tube 200 and move relative to the outer wall of the furnace tube 200, the rolling unit 131 can roll cooperatively with the furnace tube 200.

It should be noted that the specific structure of the rolling support structure is not limited to this and can be any structure that provides rolling support for the furnace tube 200 during the process of pushing the furnace tube 200 to move. For example, the rolling support structure can include a bracket and a plurality of rolling balls filling the bracket. The plurality of rolling balls can be arranged in a matrix and in a staggered pattern. Each rolling ball can roll in various directions by staying in the bracket.

During the installation of the furnace tube 200, the distance that the operator pushes the furnace tube 200 along the second horizontal direction can be appropriately designed based on actual needs. However, the length of the furnace tube 200 being pushed into the furnace body needs to be ensured that the entire furnace tube 200 can be effectively supported. For example, if more than half of the furnace tube 200 is pushed into the furnace body, the loading and unloading mechanism 300 can be controlled to drive the furnace tube assembly and disassembly auxiliary device 100 to descend. After the furnace tube 200 is separated from the furnace tube assembly and disassembly auxiliary device 100, the furnace tube 200 can continue to be pushed into the furnace body to finish the installation of the furnace tube 200. It should be noted that if the specific structure and matching method of the furnace tube 200 and the rolling support structure cause the furnace tube 200 to have a certain limitation for the push travel distance, the furnace tube 200 may need to be ensured to be pushed to the limit of the push travel distance (i.e., the position where the furnace tube 200 cannot be pushed forward or may not need to be pushed forward, and the position closest to the furnace opening), the length of the furnace tube 200 in the furnace body satisfies the above requirement.

Figure 4:
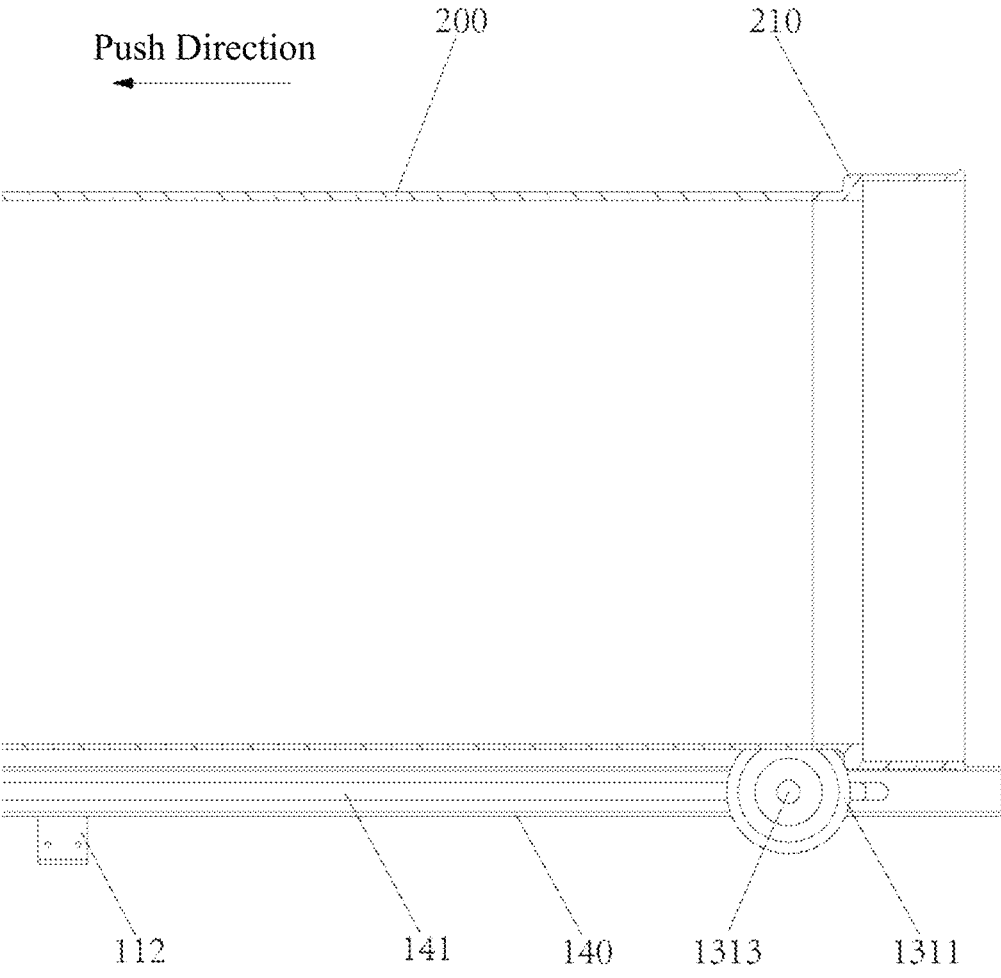
FIG. 4 is a schematic diagram showing a status when a roll unit of the furnace tube assembly and disassembly auxiliary device of FIG. 2 is abutted against by a protrusion of the furnace tube.

As shown in FIGS. 2 and 4, in some embodiments, the outer wall of the furnace tube 200 includes a protrusion 210 that extends radially and outwardly. For example, in the specific embodiments shown in FIGS. 1 and 4, the furnace tube 200 is a specially shaped tube used in the horizontal diffusion equipment or horizontal annealing equipment. The front end of the furnace tube 200 (i.e., the end close to the furnace opening when the installation is completed) has an outer diameter larger than the outer diameter of other parts of the tube to form a flared member. The flared member is the protrusion 210. Of course, in some other embodiments not shown in the figures, the protrusion 210 can be a structure protruding outward arranged in the middle or other positions of the outer wall of the furnace tube 200. When the outer wall of the furnace tube 200 has the protrusion 210, if the installation position of the rolling unit 131 on the supporting body 120 is always fixed, the protrusion 210 can be blocked when reaching the rolling unit 131 as the furnace tube 200 is pushed to move and cannot continuously be pushed to move. Thus, the push travel distance of the furnace tube 200 can be relatively short, and the length of the furnace tube 200 being pushed into the furnace body cannot satisfy the requirement. Then, if the furnace tube 200 needs to continue to be pushed to move, the part of the furnace tube 200 corresponding to the protrusion 210 can be lifted up a certain height to cause the protrusion 210 to cross over the rolling unit 131. Thus, the operation is not convenient.

To solve the above problem, the supporting body 120 also includes a plurality of first guide members 140. The plurality of first guide members 140 can be in a one-to-one correspondence with the plurality of rolling unit groups 130. Each rolling unit group 130 can be arranged at a corresponding first guide member 140. In each rolling unit group 130, at least one rolling unit 131 can be movably arranged at the corresponding first guide member 140 along the second horizontal direction. When the furnace tube 200 is pushed to move until the protrusion directly or indirectly abuts against the rolling unit 131 that can be movably arranged. The protrusion 210 can apply an external force to the rolling unit 131 along the pushing direction to drive the rolling unit 131 to move along the pushing direction with the furnace tube 200. Thus, the furnace tube 200 can continue to be pushed to move, which reduces the loss in the pushing travel distance of the furnace tube 200 caused by rolling unit 131 blocking the protrusion 210. The length of the furnace tube 200 being pushed into the furnace body can be ensured to satisfy the requirement, and the safety performance can be better. Meanwhile, the part corresponding to the protrusion 210 when the furnace tube 200 is pushed may not need to be lifted up to avoid the rolling unit 131, and the operation can be convenient.

The pushing direction is the direction in which the operator pushes the furnace tube 200, which can be roughly the positive direction of the second horizontal direction (i.e., the positive y-axis direction) or the negative direction of the second horizontal direction (i.e., the negative y-axis direction). In some embodiments, all the rolling units 131 can be movably arranged along the second horizontal direction. However, in other embodiments, only rolling units 131 that are more likely block the protrusion 210 can be set movable. For example, in each rolling unit group 130, the first or the first several rolling units 131 arranged close to the protrusion of the front end of the furnace tube 200 can be set as movable. In addition, when the protrusion 210 directly contacts a certain rolling unit 131, the protrusion 210 can directly abut against the rolling unit 131. When the protrusion 210 has already driven a rolling unit 131 to move synchronously, and the protrusion 120 and the rolling unit

131 abut against a next rolling unit 131, the protrusion 210 can be considered to indirectly abut against the next rolling unit 131.

Figure 5:
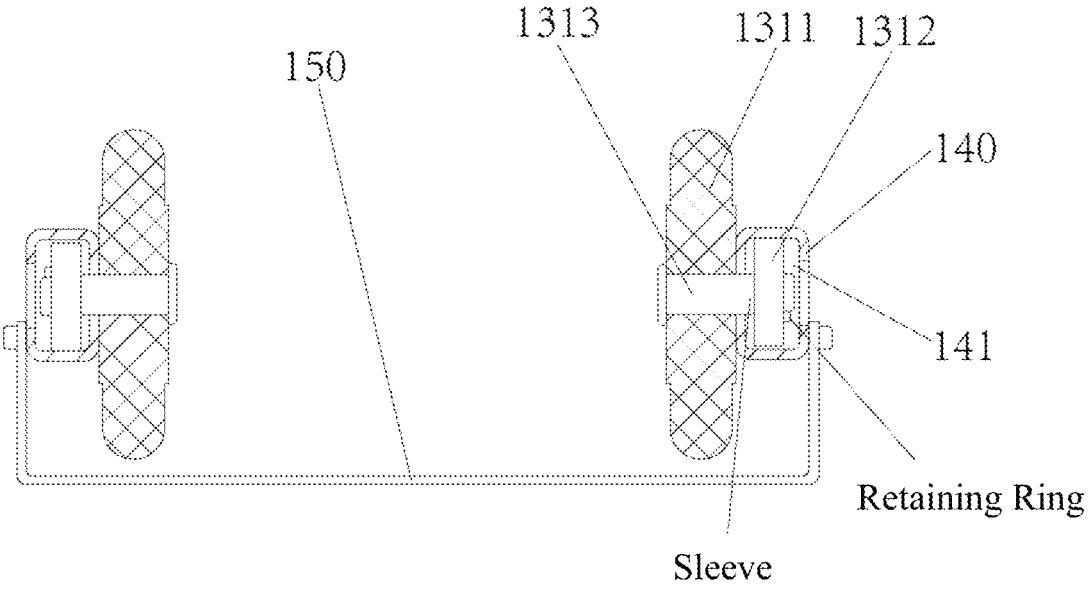
FIG. 5 is a schematic structural diagram showing a cross-section view along A-A of a cooperation between the roll unit of the furnace tube assembly and disassembly device of FIG. 3 and a first guide member, which shows specific structures of the roll unit and the first guide member and a cooperation relationship of the roll unit and the first guide member.

As shown in FIGS. 2, 4, and 5, in some embodiments, the first guide member 140 includes an accommodation groove 141 extending along the second horizontal direction. The rolling unit 131 movably arranged on the first guide member 140 includes a first rolling member 1311, a second rolling member 1312, and a connection shaft 1313. The first rolling member 1311 can be cooperative with the furnace tube 200 and can be configured to support the furnace tube 200. The second rolling member 1312 is arranged in the accommodation groove 141. The connection shaft 1313 can be configured to rotatably connect the first rolling member 1311 and the second rolling member 1312. When the furnace tube 200 is pushed to move, the first rolling member 1311 can roll cooperatively with the outer wall of the furnace tube 200, until the protrusion 210 directly or indirectly abuts the first rolling member 1311. By driving, by the protrusion 210, the first rolling member 1311 and the connection shaft 1313 to move along the second horizontal direction, the furnace tube 200 can drive the second rolling member 1312 to roll along the accommodation groove 141. Then, the second rolling member 1312 can roll cooperatively with the accommodation groove 141, which can be beneficial to reduce the friction when the rolling unit 131 moves along the first guide member 140.

The first rolling member 1311 can rotate relative to the connection shaft 1313 or can be fixed relative to the connection shaft 1313. When the first rolling member 1311 rotates relative to the connection shaft 1313, the connection shaft 1313 can rotate relative to the second rolling member 1312 or can be fixed relative to the second rolling member 1312. When the first rolling member 1311 is fixed relative to the connection shaft 1313, the connection shaft 1313 must be able to rotate relative to the second rolling member 1312.

In specific embodiments shown in FIGS. 2, 4, and 5, two rolling unit groups 130 are provided. Two first guide members 140 are provided. The first guide member 140 can be made of stainless steel. The two rolling unit groups 130 can be arranged at opposite sides of the two first rolling members 140, respectively. The first rolling member 1311 of each rolling unit 131 can be a PVC roller, and the second rolling member 1312 can be a bearing. An accommodation groove 141 is formed inside the first guide member 140. Openings of the accommodation grooves 141 of the two first guide members 140 can face each other. The bearing can be embedded in the accommodation groove 141. Since the size of the opening of the accommodation groove 141 can be smaller than the size of the inner part of the accommodation groove 141, the bearing can be ensured to be not separated from the accommodation groove 141. The first end of the connection shaft 1313 can be arranged at the center of the PVC roller, and the end surface of the first end can cooperate with the PVC roller through a position-limiting edge. The second end of the connection shaft 1313 can pass through the opening of the accommodation groove 141 to the accommodation groove 141. A sleeve is arranged at the part of the connection shaft 1313 passing into the accommodation groove 141. The part can pass through the inner circle of the bearing and can be fixedly connected to the inner circle. The end surface of the second end can cooperate with the bearing to limit the position by providing a retaining ring.

When the furnace tube 200 does not directly or indirectly abut against the PVC roller, and the PVC roller contacts the outer wall of the furnace tube 200, as the furnace tube 200 moves, the PVC roller can roll cooperatively with the outer wall of the furnace tube 200. Then, the PVC roller can rotate around the connection shaft 1313. When the furnace tube 200 is pushed to the protraction 210 at the front to directly or indirectly abut against the PVC roller, the furnace tube 200 can drive the PVC roller and the connection shaft 1313 to move along the push direction through the protrusion 210 to drive the bearing to roll in the accommodation groove 141 along the accommodation groove 141. Then, the PVC roller, the connection shaft 1313, and the bearing can move along the push direction as a whole. The inner circle and the outer circle of the bearing can rotate relatively or may not rotate relatively.

In some embodiments, the second rolling member 1312 is not limited to the bearing and can include any member that can roll. In addition, the specific structure of the rolling member 131 and the method of causing the rolling member 131 and the first guide member 140 to be movable relatively are not limited. In some other embodiments, the second rolling member 1312 may not be provided, but a slidable structure can be provided. The slidable structure can be fixedly connected to the connection shaft 1313. When the furnace tube 200 drives the first rolling member 1311 and the connection shaft 1313 to move along the push direction through the protrusion 210, the slidable structure can slide along the first guide member 140. In addition, in some other embodiments, if the shape of the furnace tube 200 is a regular straight tube, e.g., the furnace tube 200 used by PECVD equipment or LPCVD equipment. The furnace tube 200 may not have the protrusion 210. Thus, each rolling unit 131 can be fixedly arranged relative to the support body 120.

Figure 3:
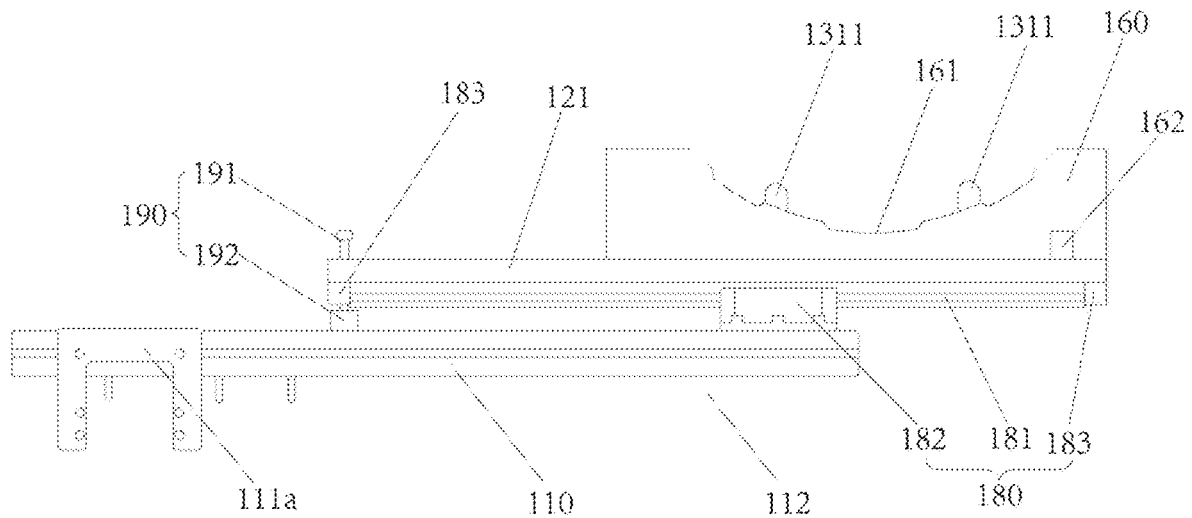
FIG. 3 is a schematic structural diagram showing a side view of the furnace tube assembly and disassembly auxiliary device of FIG. 2.

As shown in FIGS. 1 to 3, in some embodiments, the supporting body 120 includes a plurality of auxiliary supporting structures 160. The plurality of auxiliary supporting structures 160 are spaced apart along the second horizontal direction. When the furnace tube 200 is placed on the rolling support structure, the furnace tube 200 is positioned above each auxiliary supporting structure 160, and has a gap with each auxiliary supporting structure. Under normal circumstances, the furnace tube 200 can be supported by the rolling support structure, with no contact between the furnace tube 200 and each of the auxiliary supporting structures 160. If the rolling support structure fails, i.e., the rolling support structure cannot effectively and stably support the furnace tube 200, the plurality of auxiliary supporting structures 160 can perform auxiliary support on the furnace tube 200 together to protect the furnace tube 200 to cause the furnace tube 200 does not fell.

In some embodiments, the supporting body 120 includes two mounting bases 121 arranged opposite to each other along the second horizontal direction. Two auxiliary supporting structures 160 are provided and arranged at the two mounting bases 121, respectively. Generally, the length of the furnace tube 200 can be greater than the distance between the two mounting bases 121. If the rolling support structure fails, no matter to which position the furnace tube 200 is pushed, at least one auxiliary supporting structure 160 can be ensured to support and protect the furnace tube 200. Of course, in other embodiments not shown in the figures, the specific number of auxiliary supporting structures 160 can be reasonably designed as needed.

Furthermore, in some embodiments, the auxiliary supporting structure 160 can be made of an elastic material, such as rubber. If the rolling support structure fails, the furnace tube 200 can fall onto the auxiliary supporting structure 160. The auxiliary supporting structures 160 made of the elastic material can provide certain cushioning to prevent damage to the furnace tube 200. In addition, as shown in FIGS. 2 and 3, the top of the auxiliary supporting structure 160 forms an arc-shaped support surface 161. The arc-shaped support surface 161 can be configured to support the furnace tube 200. The shape of the arc-shaped support surface 161 can match the shape of the outer wall of the furnace tube 200 to stably support the furnace tube 200.

It is important to note that when the rolling support structure functions normally, after the furnace tube 200 is placed on the rolling support structure, the furnace tube 200 should be positioned above each auxiliary support structure 160 with a gap between each auxiliary support structure 160. The first rolling members 1311 of the plurality of rolling units 131 (the plurality of rolling units 131 belong to different rolling unit groups 130) that are in a one-to-one correspondence in the first horizontal direction can support the furnace tube 200 together. The center of the circumference (conforming to the outer contour of the cross-section of the furnace tube 200) where the supporting points configured to support the furnace tube 200 are of the plurality of rolling members 1311 can be higher than the center of the circumference (conforming to the outer contour of the cross-section of the furnace tube 200) where the arc-shaped support surface 161 are. In some other embodiments, the auxiliary support structure 160 can be made of other materials or can be other structural shapes, as long as the auxiliary support structure 160 can auxiliary support and protect the furnace tube 200.

As shown in FIGS. 2 and 3, in some embodiments, the furnace tube assembly and disassembly auxiliary device 100 also includes a handheld structure 170. The handheld structure 170 is connected to the supporting body 120. By manually pushing or pulling the handheld structure 170, the supporting body 120 can be driven to move relative to the base 110 along the first horizontal direction. That is, the adjustment of the positions of the supporting body 120 and the furnace tube 200 along the first horizontal direction can be performed manually by the operator. Thus, the structure can be simple, and the operability can be flexible and convenient. It should be noted that when manually adjusting the position of the supporting body 120 relative to the base 110 in the first horizontal direction using the handheld structure 170. In the ideal state, the furnace tube 200 should be adjusted until the axis of the furnace tube 200 to overlap the axis of the installation chamber of the furnace body. When the actual adjustments are performed, if the operator can observe and align manually, the axis of the furnace tube 200 can have a certain displacement with the axis of the installation chamber of the furnace body. However, the displacement can be within an appropriate range.

Meanwhile, the furnace tube assembly and disassembly device 100 further includes a moving guide structure 180. The moving guide structure 180 can be arranged between the base 110 and the supporting body 120 and can be configured to guide the movement when the supporting body 120 moves relative to the base 110. In some embodiments, the moving guide structure 180 can include a second guide member 181 and a sliding member 182. The second guide member 181 can be connected to one of the bases 110 and the support body 120. The sliding member 182 can be connected to the other one of the bases 110 and the second guide member 181. Thus, when the handheld structure 170 is pushed and pulled manually to drive the supporting body 120 to move, the moving guide can be performed on the supporting body 120. Thus, the position adjustment operation performed by the operator on the supporting body 120 and the furnace tube 200 along the first horizontal direction can be easier and less labor-intensive.

Furthermore, as shown in FIGS. 2 and 3, in some embodiments, the supporting body 120 includes two mounting bases 121 arranged opposite to each other along the second horizontal direction. Two bases 110 and two mobile guiding structures 180 are provided. The two bases 110 are under the two mounting bases 121, respectively. The two moving guide structures 180 can be arranged between corresponding mounting bases 121 and the bases 110, respectively. The two ends of the handheld structure 170 can be connected to the two mounting bases 121, respectively. Thus, when the handheld structure 170 is pushed and pulled manually, the two mounting bases 121 can be driven to move synchronously.

In addition, in the plurality of first guide members 140, two ends of each first guide member 140 can be connected to the two mounting bases 121, respectively. Since the first guide member 140 is relatively long and includes the accommodation groove 141 arranged inside the first guide member 140 along the extension direction of the first guide member 140, to ensure the strength of the first guide member 140 and prevent the first guide member 140 from bending after a long time, the two neighboring first guide members 140 can be connected through a reinforcing connector 150. In some embodiments, two first guide members 140 can be provided. The two first guide members 140 can be connected through a plurality of reinforcing connectors 150. The plurality of reinforcing connectors 150 can be arranged at a space along the second horizontal direction. It can be understood that the first guide member 140 can be reinforced in another method. For example, a solid divider can be arranged in each accommodation groove 141 to divide the accommodation groove 141 into a plurality of segments. The solid divider can be configured to reinforce the first guide member 140.

On one hand, the configuration of the two mounting bases 121 and the two bases 110 can be beneficial to reduce the overall weight of the device. On the other hand, the two ends of the handheld structure 170 and the two ends of the first guide member 140 can be detachably connected to the two mounting bases 121. For furnace tubes 200 of different lengths in different horizontal semiconductor equipment, the furnace tube assembly and disassembly auxiliary device 100 can adapt to the furnace tubes 200 with different lengths by replacing the handheld structure 170 and the first guide members 140 with suitable lengths. Thus, the furnace tube assembly and disassembly auxiliary device 100 can have better compatibility with different horizontal semiconductor equipment. The handheld structure 170 and the first guide member 140 can be replaced conveniently.

In embodiments shown in FIGS. 2 and 3, the second guide member 181 is connected to the bottom surface of the mounting base 121, and the sliding member 182 is connected to the top surface of the base 110 through a mounting plate. Meanwhile, two position limiting members 183 are arranged on two ends of the second guide member 181, respectively. When the sliding member 182 slides along the second guide member 181 and contacts either of the position limiting members 183, the sliding member 182 can be blocked by the position limiting member 183 to prevent the sliding member 182 from detaching from the second guide member 181 during the position adjustment process, which could pose a safety risk. In some embodiments, the second guide member 181 is a guide rail. The sliding member 182 can be a sliding piece sleeved at the sliding rail. The position limiting members 183 can be position limiting blocks arranged at the front end and the rear end of the guide rail. In some other embodiments, the second guide member 181 can also be a guide groove. The sliding member 182 can be a sliding piece embedded in the guide groove. The position limiting member 183 can be end walls of the front end and the rear end of the guide groove.

It should be noted that in other embodiments not shown in the figures, the movement of the supporting body 120 relative to the base 110 along the first horizontal direction can also be driven by a servo motor or other driving devices, which, however, can increase the complexity and weight of the device. In addition, if the furnace tube 200 and the furnace body need to be precisely aligned, a position detection sensor can be arranged in the device, or an external position detection tool can be employed to perform the position detection during alignment.

As shown in FIGS. 2 and 3, in some embodiments, the furnace tube assembly and disassembly auxiliary device 100 also includes a locking structure 190. The locking structure 190 cooperates with the base 110 and the supporting body 120. The locking structure 190 is configured to lock the movement of the supporting body 120 relative to the base 110 along the first horizontal direction. In some embodiments, the locking structure 190 includes an unlocked status that allows relative movement between the supporting body 120 and the base 110, and a locked status that fixes the relative position between the supporting body 120 and the base 110. When the locking structure 190 is in the unlocked status, the supporting body 120 can be controlled to move along the first horizontal direction relative to the base 110. After the supporting body 120 moves to the required position relative to the base 110, the locking structure 190 can be switched to the locked status to reliably fix the relative position of the supporting body 120 and the base 110. The supporting body 120 and the base 110 may no longer move relatively. Then, the axis of the furnace tube 200 can overlap with the axis of the mounting chamber of the furnace body, or the displacement of the axes may be within an appropriate range. When subsequently the furnace tube 200 is pushed to move along the second horizontal direction, the supporting body 120 can stably support the furnace tube 200. The relative position between the axis of the furnace tube 200 and the axis of the mounting chamber may not change to prevent the axis of the furnace tube 200 from displacing horizontally (e.g., displacing along the first horizontal direction). Thus, the situation that the furnace tube 200 cannot be mounted inside the furnace body or the furnace tube 200 collides to be damaged can be avoided.

The structure of the locking structure 190 is not limited and can include any structure that realizes the selective locking between the supporting body 120 and the base 110. For example, in some embodiments of the figure, the locking structure 190 includes an adjustment screw 191 and a locking pressing block 192. The mounting base 121 has a threaded hole. The adjustment screw 191 is inserted into the threaded hole. The adjustment screw 191 can cooperate with the threaded hole. An end of the adjustment screw 191 facing the base 110 is connected to the locking pressing block 192. By rotating the adjustment screw 191, the locking pressing block 192 can be driven to move up and down relative to the mounting base 121. When the lock pressing block 192 moves down to press the top surface of the base 110, the supporting body 120 and the base 110 can be relatively fixed and may not move relatively. Then, the locking structure 190 can be in the locked status. When the locking pressing block 192 moves up to depart from the top surface of the base 110, the supporting body 120 can move relative to the base 110. Then, the locking structure 190 can be in the unlocked status. It can be understood that, in other embodiments not shown in the figure, the locking structure 190 can also include other structures, e.g., the inserted cooperation method of the pin and the locking hole and the cooperation method of a snap and a slot.

As shown in FIGS. 1 to 3, in some embodiments, the loading and unloading mechanism 300 includes a fixed frame 310 and a robotic manipulator 320 arranged at the top of the fixed frame 310. The base 110 is provided with a robotic manipulator connector. The robotic manipulator connector can be detachably connected to the robotic manipulator 320 of the loading and unloading mechanism 300. Typically, the horizontal semiconductor equipment also includes a purification station. The purification station is arranged on the side of the furnace body. The loading and unloading mechanism 300 is arranged inside the purification station. Two robotic manipulators 320 are provided. The two robotic manipulators 320 can extend and retract forward and backward, and ascend and descend. A wafer boat can be lifted and transferred to a boat push and pull mechanism of the semiconductor equipment by the two robotic manipulators 320. Then, the wafer boat can be transferred by the boat push and pull mechanism into the reaction chamber formed in the furnace tube 200 for processing.

In some embodiments, the robotic manipulator connectors can be divided into two groups. Each group of the robotic manipulator connectors can be connected to a robotic manipulator 320. Each group of the robotic manipulator connectors can include a first robotic manipulator connection plate 111*a* and a second robotic manipulator connection plate 111*b*. The first robotic manipulator connection plate 111*a* can be arranged on an outer side of the base 110 and configured to be connected to a side surface of the robotic manipulator 320. The second robotic manipulator connection plate 111*b* can be arranged on an inner side of the base 110 and configured to be connected to the top surface of the robotic manipulator 320. It needs to be noted, the robotic manipulator 320 can have some threaded holes. The first robotic manipulator connection plate 111*a* and the second robotic manipulator connection plate 111*b* of the furnace tube assembly and disassembly auxiliary device 100 can be fixed to the threaded holes through bolts or screws.

In addition, the bottom surface of the base 110 is provided with a mounting pad 112. The mounting pad 112 can be configured to cooperate with the robotic manipulator 320 after being connected to the robotic manipulator 320 of the loading and unloading mechanism 300 at the base 110. Through the contact and cooperation of the mounting pad 112 and the robotic manipulator 320, the base 110 can be reliably supported. Of course, the number and position of the mounting pads 112 are not limited and can be appropriately designed as needed.

As shown in FIG. 1, in some embodiments, the loading and unloading mechanism 300 also includes an electric cylinder assembly. The electric cylinder assembly is arranged at the fixed frame 310. The robotic manipulator 320 can be driven by and connected to the electric cylinder assembly. The electric cylinder assembly includes a servo motor 330 and a transmission member (e.g., a ball screw and nut) to drive the robotic manipulator 320 to move. The transmission member can be configured to convert the rotation output by the servo motor 330 into a straight line movement, which are known technology and are not repeated here. Since the servo motor 330 of the loading and unloading mechanism 300 drives the robotic manipulator 320 to drive the furnace tube assembly and disassembly auxiliary device 100 to ascend and descend along a vertical direction. The servo motor 330 can be controlled by the control system to cause the servo motor 330 to have a speed mode and a position mode. When the servo motor 330 is in the speed mode, the furnace tube assembly and disassembly auxiliary device 100 can be driven to quickly reach the mounting height of the furnace tube 200. When the servo motor 330 is in the position mode, the height position of the furnace tube assembly and disassembly auxiliary device 100 can be precisely micro-tuned. An adjustment accuracy can be 1 mm Thus, the mounting precision of the furnace tube 200 can be caused to be higher.

Furthermore, it should be noted that before the furnace tube assembly and disassembly auxiliary device 100 ascends or descends, the furnace tube 200 has already been placed on the supporting body 120. To ensure the secure fixation of the furnace tube 200 when furnace tube assembly and disassembly ascending and descending and being aligned horizontally, additional fixation can be performed on the furnace tube 200. For example, a flexible rope can pass through a through-hole 162 of the auxiliary supporting structure 160, and the flexible rope can be tied to the furnace tube 200. Before pushing the furnace tube 200 to move along the second horizontal direction, the additional fixation can be performed on the furnace tube 200. Of course, if the furnace tube 200 is arranged at the supporting body 120, the stability of the furnace tube 200 can be ensured, and the additional fixation may not need to be performed.

It can be understood that the above embodiments are merely exemplary embodiments to illustrate the principles of the present disclosure. However, the present disclosure is not limited to this. For those skilled in the art, without departing from the spirit and essence of the present disclosure, various modifications and improvements can be made. These modifications and improvements are within the scope of the present disclosure.

What is claimed is:

1. A furnace tube assembly and disassembly auxiliary device, configured to support a furnace tube when the furnace tube of horizontal semiconductor equipment is mounted to a furnace body or is removed from the furnace body, the furnace tube assembly and disassembly auxiliary device comprising:

a base configured to detachably be connected to a loading and unloading mechanism of the horizontal semiconductor equipment to cause the loading and unloading mechanism to drive the base to ascend and descend vertically; and a supporting body arranged on the base and moving along a first horizontal direction relative to the base, the supporting body including a rolling support structure, the rolling support structure being configured to support the furnace tube, and being roll-cooperated with the furnace tube when the furnace tube is being pushed to cause the furnace tube to move along a second horizontal direction, the second horizontal direction having a predetermined angle with the first horizontal direction.

2. The furnace tube assembly and disassembly auxiliary device to claim 1, wherein:

each first guide member includes an accommodation groove extending along the second horizontal direction;

the second rolling element of each rolling unit is arranged in the corresponding accommodation groove; and the connection shaft of each rolling unit is configured to rotatably connect the corresponding first rolling member and the corresponding second rolling member.

3. The furnace tube assembly and disassembly auxiliary device according to claim 2, wherein the supporting body also includes a plurality of auxiliary support structures arranged at intervals along the second horizontal direction, the furnace tube is above the auxiliary support structures and has a gap between the auxiliary support structures when being placed on the rolling support structure, and the plurality of auxiliary support structures are configured to support the furnace tube when the rolling support structure fails.

4. The furnace tube assembly and disassembly auxiliary device according to claim 3, wherein the auxiliary support structures are made of elastic material; and/or the top of the auxiliary support structures has an arc-shaped support surface of the furnace tube, and a shape of the arc-shaped support surface is adapted to a shape of the outer wall of the furnace tube.

5. The furnace tube assembly and disassembly auxiliary device according to claim 1, wherein:

the supporting body includes two mounting bases arranged opposite to each other along the second horizontal direction;

two ends of the first guide member are connected to the two mounting bases, respectively; and neighboring two first guide members are connected by reinforcement connectors.

6. The furnace tube assembly and disassembly auxiliary device according to claim 1, further comprising:

a handheld structure connected to the supporting body, and configured to be manually pushed and pulled to drive the supporting body to move relative to the base in the first horizontal direction; and a mobile guide structure including:

a second guide member connected to one of the base and the supporting body; and a sliding member connected to the other one of the base and the supporting body, slidably arranged at the second guide member along the first horizontal direction, the supporting body being guided when the handheld structure is manually pushed and pulled to drive the supporting body to move.

7. The furnace tube assembly and disassembly auxiliary device according to claim 6, wherein:

the supporting body includes two mounting bases arranged opposite to each other along the second horizontal direction;

two bases and two mobile guide structures are provided; and the two bases are arranged below the two mounting bases, respectively, the two mobile guide structures are arranged between the corresponding mounting bases and the bases, respectively, and two ends of the handheld structure are connected to the two mounting bases, respectively, to drive the two mounting bases to move synchronously when the handheld structure is pushed and pulled.

8. The furnace tube assembly and disassembly auxiliary device according to claim 6, further comprising:

a locking structure cooperating with the base and the supporting body and configured to lock the movement of the support body relative to the base along the first horizontal direction.

9. The furnace tube assembly and disassembly auxiliary device according to claim 1, wherein:

the base includes a robotic manipulator connector configured to be detachably connected to a robotic manipulator of the loading and unloading mechanism; and/or a mounting pad is arranged at the bottom surface of the base, configured to contact and cooperate with the robotic manipulator after the base is connected to the robotic manipulator of the loading and unloading mechanism, through the contact and cooperation of the mounting pad and the robotic manipulator, provide support to the base.

* * * * *